United States Patent
Otaka et al.

(10) Patent No.: US 6,653,634 B1
(45) Date of Patent: Nov. 25, 2003

(54) METHOD OF MEASURING LENGTH WITH SCANNING TYPE ELECTRON MICROSCOPE

(75) Inventors: Tadashi Otaka, Hitachinaka (JP); Kouichi Nagai, Kawasaki (JP)

(73) Assignees: Hitachi, Ltd., Tokyo (JP); Fujitsu Limited, Kanagawa (JP)

(*) Notice: Subject to any disclaimer, the term of this patent is extended or adjusted under 35 U.S.C. 154(b) by 0 days.

(21) Appl. No.: 09/575,635

(22) Filed: May 22, 2000

(30) Foreign Application Priority Data

May 24, 1999 (JP) .............................. 11-143753

(51) Int. Cl.$^7$ ................. G02B 21/18; G01B 11/00; H01J 37/256; H01J 37/28
(52) U.S. Cl. ................. 250/311; 250/252.1; 250/306; 250/307; 250/310
(58) Field of Search .................. 250/311, 310, 250/306, 307, 358, 363.1, 363.07, 363.04, 345.1

(56) References Cited

U.S. PATENT DOCUMENTS

| | | | | |
|---|---|---|---|---|
| 3,757,117 A | * | 9/1973 | Muller et al. ............... 250/306 |
| 4,068,381 A | * | 1/1978 | Ballard et al. .............. 250/310 |
| 4,803,524 A | * | 2/1989 | Ohno et al. .................. 355/53 |
| 4,818,873 A | * | 4/1989 | Herriot ..................... 250/252.1 |
| 4,908,656 A | * | 3/1990 | Suwa et al. ................... 355/53 |
| 4,943,148 A | * | 7/1990 | Mondragon et al. ........... 269/97 |
| 4,999,496 A | * | 3/1991 | Shaw et al. .................. 250/306 |
| 5,519,216 A | * | 5/1996 | Benner et al. ............... 250/307 |
| 5,598,002 A | | 1/1997 | Todokoro et al. ............ 250/310 |
| 5,825,670 A | * | 10/1998 | Chernoff et al. ............. 250/307 |
| 5,872,358 A | | 2/1999 | Todokoro et al. ........... 250/310 |
| 6,067,164 A | * | 5/2000 | Onoguchi et al. ........... 250/307 |
| 6,384,408 B1 | * | 5/2002 | Yee et al. ................. 250/252.1 |

FOREIGN PATENT DOCUMENTS

JP 08-031363 2/1996

* cited by examiner

*Primary Examiner*—John R. Lee
*Assistant Examiner*—Bernard E. Souw
(74) *Attorney, Agent, or Firm*—Kenyon & Kenyon

(57) ABSTRACT

A method of measuring length with a scanning type electron microscope (SEM) includes the steps of: performing length measurement with the SEM of an already know pattern provided in advance in a predetermined region on a specimen (S 101~S 104); obtaining a magnification correction coefficient through comparison of the length measurement result with the designed value of the already known pattern (S 105, S 108); and determining a true size by multiplying a measured length value of a measurement point performed by the SEM by the obtained magnification correction coefficient (S 109~S 111), thereby, a method which is free from a length measurement error regardless to the constitution of the specimen and the film type thereof.

11 Claims, 15 Drawing Sheets

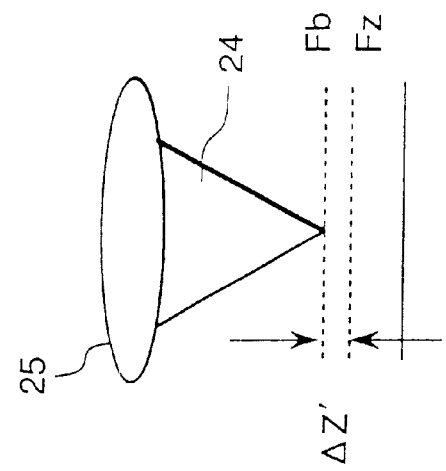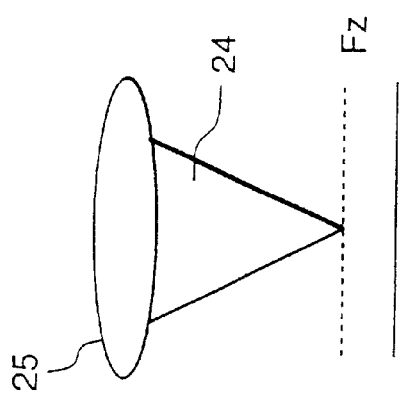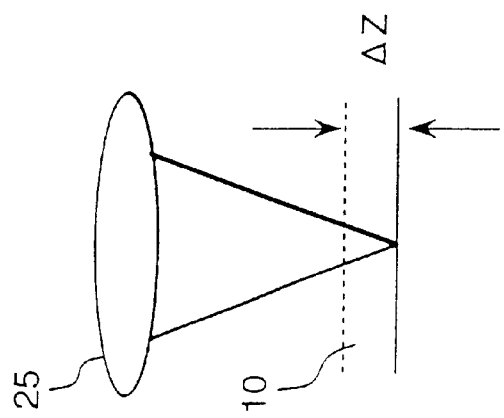

METHOD OF MEASURING LENGTH WITH SCANNING TYPE ELECTRON MICROSCOPE

BACKGROUND OF THE INVENTION

1. Field of the Invention

The present invention relates to a method of measuring length with a scanning type electron microscope (hereinbelow, called as SEM), and in particular, relates to a method of measuring length with an SEM which is suitable for length measurement and detection for a semiconductor device.

2. Conventional Art

Recent SEMs, in particular, SEMs for length measurement are required that a measured length value shows a true value and does not includes a variation and offset depending on such as constitution and film type of a specimen to which length measurement has been performed. Conventionally, as a size calibration measure for the length measurement SEM a pitch pattern is prepared by making use of a material such as Al and W which generates less charges on a Si, and through matching the measured length value to the prepared pitch pattern a length measurement calibration value for the length measurement SEM is obtained.

Further, for recent length measurement SEMs, in order to enhance secondary electron resolution a retarding electric field method (hereinbelow, simply called as a retarding method) is employed in which an acceleration voltage of incident electrons is increased and a negative voltage is applied to the side of a specimen to retard the acceleration voltage of the incident electrons. More specifically, in comparison with a conventional method wherein zero voltage is applied to the side of a specimen, the retarding method is constituted in such a manner that an acceleration voltage for electrons emitted from an electron gun unit is raised by +Vr and a voltage -Vr is applied to the specimen, thereby, electrons discharged from the electron gun unit with acceleration voltage of V+Vr pass an objective lens, thereafter, are retarded by the voltage -Vr applied to the side of the specimen and finally make incident to the specimen with an acceleration voltage V. As features of the retarding method, the followings are enumerated, in that since the incident electrons at the primary side pass below to the objective lens with the acceleration voltage V+Vr, a chromatic aberration of lenses can be reduced, and since secondary electrons generated from the specimen are accelerated toward a detector by the electric field due to -Vr, a collection efficiency of the secondary electrons is enhanced.

However, in the SEM employing the above explained retarding method, since the acceleration voltage (hereinafter, sometimes called as a landing voltage) of the electron beams incident onto the specimen varies depending on the voltage applied to the side of the specimen, there arises a problem that in case when a specimen to be observed is covered by an insulation film or an insulation film is deposited on the surface thereof the landing voltage varies and the magnification (or field of view) can deviate. Since the size calibration for the length measurement SEM is performed under a constant landing voltage and a constant magnification, therefore, if one of the two varies, there causes a problem that the measured size value varies. Namely, when the landing voltage varies, a size error is caused and there arised a problem that the measured size value is not a true value.

The above problem was likely caused in the conventional length measurement SEM which does not employ the retarding method. Namely, there arose the problem likely that the landing voltage thereof varies because of a variation in surface potential of a specimen, as a result a size error is caused, and therefore, the measured size is not a true value.

Table 1 below shows results of pitch length measurement in a Si pattern formed on a Si wafer, a pattern on B-PSG film having film thickness 400 nm, a pattern on $SiO_2$ film having film thickness 10 nm, a pattern on $SiO_2$ film having film thickness 100 nm, a pattern on SiN film, a pattern on HTO+SiN film (35 nm) and a pattern on SiON film having film thickness 25 nm formed on a Si wafer, and a pattern on actual devices A and B.

Design values of length measured pitch are 350 nm, 400 nm, 500 nm, 600 nm, 700 nm and 800 nm. The unit of all numeral values in the Table is nm.

TABLE 1

| | Pitch design value (nm) | | | | | |
|---|---|---|---|---|---|---|
| | 350.00 | 400.00 | 500.00 | 600.00 | 700.00 | 800.00 |
| Si Pattern | 350.32 | 400.18 | 500.01 | 600.20 | 700.52 | 800.85 |
| B-PSG (400 nm) | 358.74 | 410.33 | 512.67 | 615.32 | 717.93 | 820.23 |
| $SiO_2$ (10 nm) | 350.35 | 400.42 | 500.47 | 600.42 | 700.55 | 800.45 |
| $SiO_2$ (100 nm) | 354.89 | 405.47 | 506.83 | 608.32 | 709.46 | 811.21 |
| SiN (10 nm) | 355.75 | 406.29 | 507.78 | 609.52 | 711.30 | 812.55 |
| HTO + SiN (35 nm) | 362.76 | 414.33 | 518.64 | 622.05 | 725.89 | 829.35 |
| SiON (25 nm) | 359.33 | 410.53 | 513.73 | 616.23 | 718.74 | 821.55 |
| Device A | 367.54 | 420.34 | 525.06 | 630.25 | 735.35 | 840.21 |
| Device B | 365.00 | 417.29 | 521.19 | 625.59 | 729.66 | 834.33 |

FIG. 18 illustrates a relationship between pitch design values (in abscissa) and SEM length measurement values (in ordinate) obtained from data in connection with Si pattern, pattern on B-PSG film and pattern of actual device A among the length measurement data as shown in Table 1. It is observed that although the pitch length measurement values of the Si pattern substantially coincide with the designed values, the pitch length measurement values of the patterns on the B-PGS insulation film and the actual device A greatly deviate from the respective designed values. It is considered that such errors in the measured values are caused due to the change-up of the specimen surface irradiated by electron beams during the pattern length measurement on the B-PSG insulation film and the actual device A.

SUMMARY OF THE INVENTION

The present invention is achieved in view of the problem encountered during the length measurement with the conventional SEMs, and an object of the present invention is to provide a method of measuring length with an SEM which prevents a conventional length measurement error depending on such as specimen constitutions and film types.

A method of measuring length with an SEM according to the present invention which resolves the above problem, is characterized in that the method comprises the steps of: performing length measurement with the SEM an already know pattern provided in advance in a predetermined region on a specimen; obtaining a magnification correction coefficient through comparison of the length measurement result with the designed value of the already known pattern; and determining a true size by multiplying a measured length value of a measurement point performed by the SEM by the obtained magnification correction coefficient.

In the above method, a specimen is used in which a particular test pattern such as lines and spaces and contact holes for obtaining correction data is in advance provided, for example, in a scribe in a semiconductor wafer specimen and in a free space in a chip. Then, the length measurement of the test pattern is performed and the magnification correction coefficient for correcting a length measurement error is determined, thereby, a size measurement error by the SEM, which is caused due to the charge up of the specimen surface (in that the surface potential variation of the place where incident electrons are irradiated), is compensated.

Further, a method of measuring length with an SEM according to the present invention, is characterized in that the method comprises the steps of: performing length measurement with the SEM a pattern on a specimen; obtaining a magnification correction coefficient through comparison of the length measurement. result with the designed value of the pattern; and determining a true size by multiplying a measured length value of a measurement point performed by the SEM by the obtained magnification correction coefficient.

In the above method, without providing on the specimen a test pattern used exclusively for determining the magnification correction coefficient and by making use of a pattern which permits measurement of a line width, a space width or a pitch among patterns in an actual device, the magnification correction coefficient is determined which compensates errors due to the charge-up of the specimen surface.

The magnification correction coefficient can be obtained for every specimen. When the specimen is a semiconductor wafer, the magnification correction coefficient can be obtained for every chip containing a measurement point. Further, the magnification correction coefficient can be obtained by making use of a pattern near a measurement point. The charge-up condition of the specimen surface delicately varies depending on a variety of causes such as structure of specimen, material thereof and a holding state of the specimen such as by a stage. Accordingly, in order to accurately compensate an error in a length measurement with the SEM caused by the charge-up, it is preferable to obtain the magnification correction coefficient by making use of a pattern in a position close to a measurement point as much as possible, because the charge-up condition of the position is considered close to that in the measurement point. When obtaining the magnification correction coefficient for every chip, or when obtaining the magnification correction coefficient by making use of a pattern near a length measurement point, the magnification correction coefficient is usually determined by making use of a pattern in an actual device without using a test pattern exclusively provided for determining the magnification correction coefficient.

When obtaining the magnification correction coefficient, it is preferable to compare a pitch length measurement result in a pattern with a designed value. This is because such as a line width and a space width in a pattern formed by exposing light may deviate from the designed value due to such as proximity effect and light interference, however, the pitch thereof mostly assumes the designed value. When obtaining pitch length measurement result, it is preferable to average a plurality of pitch length measurement results. As an embodiment for length measurement when the pitch length measurement result is used for obtaining the magnification correction coefficient, there is a method in which a pitch together with a line width and a space width at a length measurement point within a view field of the SEM are collectively measured and the measured length values of the line and space are corrected by the magnification correction coefficient obtained from the pitch length measurement result.

Further, a method of measuring length with an SEM according to the present invention, is characterized in that the method comprises the steps of: causing the SEM auto-focusing on a measurement point by making use of an output of a sensor which detects distance from an objective lens to a specimen; detecting an exciting current $\Delta Iobj$ of the objective lens representing an outof focus by monitoring a variation of a specimen signal being emitted from the specimen while varying the exciting current of the objective lens; converting the exciting current $\Delta Iobj$ of the objective lens into an acceleration voltage $\Delta V$ for incident electron beams onto the specimen; changing the acceleration voltage for the incident electron beams onto the specimen by $\Delta V$; and performing the length measurement of the measurement point.

The auto-focusing can be performed by controlling the exciting current for the objective lens as well as by mechanically moving such as a specimen stage which carries the specimen. With this method, a variation in electron beam acceleration voltage caused due to the charge-up of the specimen surface is canceled and the acceleration voltage for the electron beams incident onto the specimen can be kept at a set value, thereby, an error in the SEM length measurement value due to the charge-up of the specimen surface is eliminated.

Further, a method of measuring length with an SEM according to the present invention, is characterized in that the method comprises the steps of: causing the SEM auto-focusing on a measurement point by making use of an output of a sensor which detects distance from an objective lens to a specimen; detecting an applied voltage $\Delta Vb$ on the specimen representing an outof focus by monitoring variation of a specimen signal being emitted from the specimen while varying the voltage applied on the specimen; changing the acceleration voltage for the incident electron beams onto the specimen by $\Delta Vb$; and performing the length measurement of the measurement point.

The auto-focusing can be performed by controlling the exciting current for the objective lens as well as by mechanically moving such as a specimen stage which carries the specimen. With this method, like the previous method, a variation in electron beam acceleration voltage caused due to the charge-up of the specimen surface is canceled and the acceleration voltage for the electron beams incident onto the specimen can be kept at a set value, thereby, an error in the SEM length measurement value due to the charge-up of the specimen surface is eliminated.

Further, a method of measuring length with an SEM according to the present invention, is characterized in that the method comprises the steps of: determining in advance a correspondence between acceleration voltage of electron beams incident onto a specimen and magnification correction coefficient; determining an actual acceleration voltage of the electron beams incident onto the specimen at a length measurement point; determining a magnification correction coefficient corresponding to the actual acceleration voltage of the electron beams incident onto the length measurement point with reference to the correspondence determined in advance; performing a length measurement at the measurement point; and determining a true size by multiplying the measured length value by the magnification correction coefficient.

In the above method, any steps which determine the actual acceleration voltage for the electron beams incident onto the length measurement point on the specimen can be used, however, such step can, for example, include a step of determining an objective lens correction current ΔIobj for eliminating an outof focus under the condition of objective lens excitation corresponding to the acceleration voltage for the electron beams set at the SEM and a step of converting the objective lens correction current ΔIobj into an acceleration voltage for electron beams incident onto the specimen. Alternatively, the step can be realized by determining a specimen application voltage ΔVb for eliminating an outof focus under the condition of objective lens excitation corresponding to the acceleration voltage for the electron beams set at the SEM.

According to the length measurement method of the present invention which uses an SEM, a true size value can be obtained by compensating a length measurement error due to potential variation at the specimen surface.

Thereby, even with the commonly used length measurement SEM which does not employ the retarding method, the size measurement error due to the charge-up of the specimen surface caused by the incident electron irradiation is sufficiently corrected and a true value can be obtained regardless to the constitutions of the specimen and the types thereof. Namely, when the specimen is charged up, the surface potential of the specimen varies, and in association therewith a magnification deviation due to an error in landing voltage for incidence beams is caused which implies inclusion of an offset value into the length measurement value, however, such problem is resolved with the present invention, therefore, even if a variation in surface potential of the specimen due to electron beam irradiation is caused, a true length value can always be measured.

Further, with the length measurement SEM which uses the retarding method, the conventional problem of the deviation in magnification due to a setting error of the landing voltage is resolved. Namely, the problem is resolved which causes a size error depending on specimens to be subjected to length measurement such as when an insulation film is deposited on the surface of the specimen or when an interlayer structure for the portion where the electron beams are irradiated varies, and a true length value can always be measured.

Further, according to an embodiment of the present invention, the acceleration voltage for electron beams incident onto the specimen can always set at the design value regardless to the constitution of the specimen and the type thereof.

BRIEF DESCRIPTION OF THE DRAWINGS

FIGS. 11(a), 11(b) and 11(c) are schematic diagrams for explaining methods of adjusting height of a length measurement SEM;

DETAILED DESCRIPTION OF THE PREFERRED EMBODIMENTS

Hereinbelow, embodiments of the present invention will be explained in detail with reference to the drawings. Further, in the followings, the present invention will be explained primarily when the same is applied for pattern measurement on a semiconductor wafer with a length measurement SEM, however, the present invention is never limited to such application.

Figure 1:
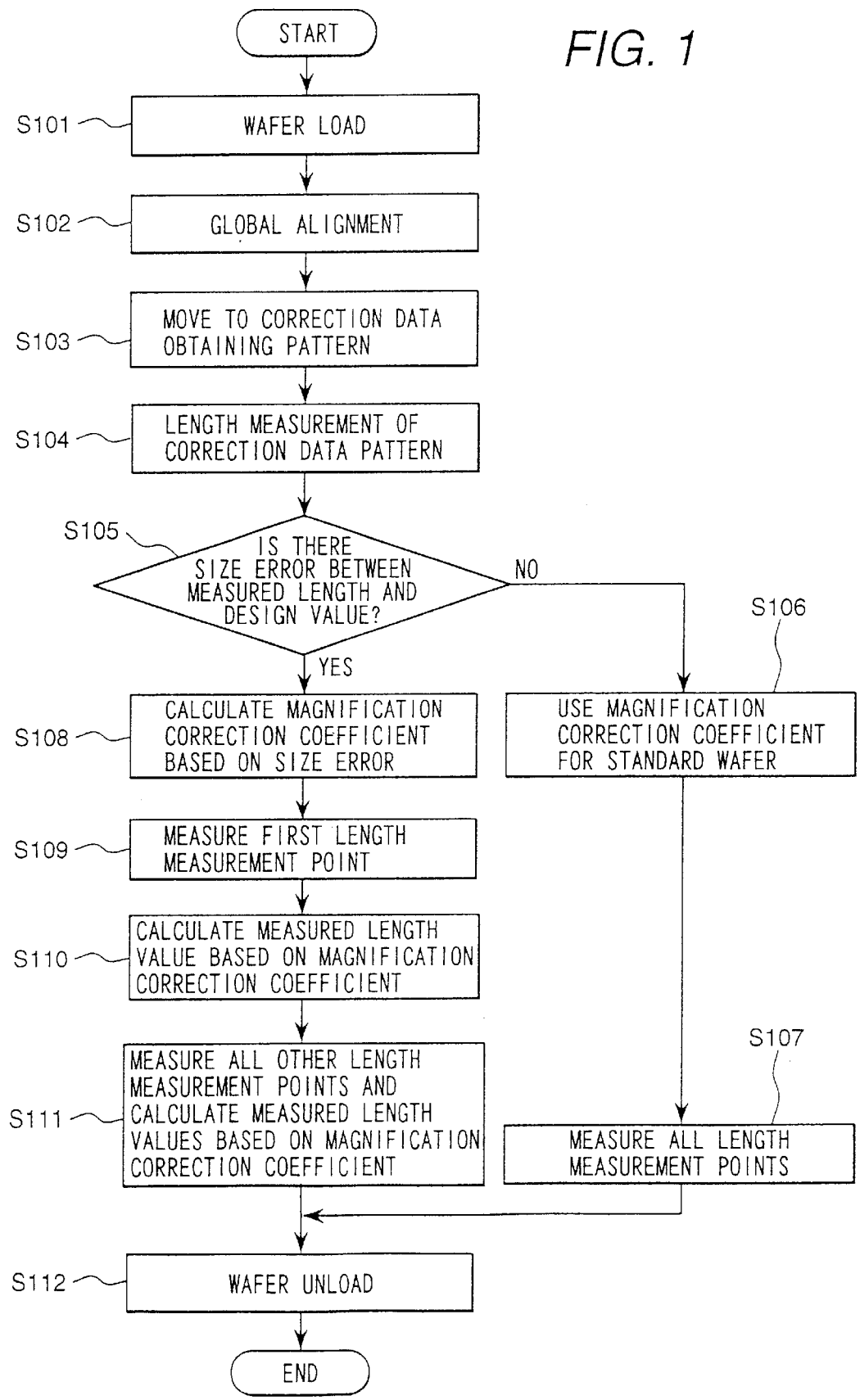
FIG. 1 is a flow chart for explaining an embodiment of length measurement method with a length measurement SEM according to the present invention.

FIG. 1 is a flow chart for explaining an embodiment of a length measurement method with a length measurement SEM according to the present invention. At first, a wafer to be subjected to length measurement with a length measurement SEM is placed in a chamber (S 101) and a global alignment therefor is performed (S 102). In the global alignment, for example, already known two points on the wafer are detected with an optical microscope and an alignment of the wafer in translation direction and in rotation direction is performed, and the global alignment is performed for the purpose of matching the wafer coordinate system with the stage coordinate system for the length measurement SEM. Thereafter, prior to performing length measurement of a first length measurement point the measurement process moves to a pattern used for obtaining correction data (S 103).

Figure 2C:
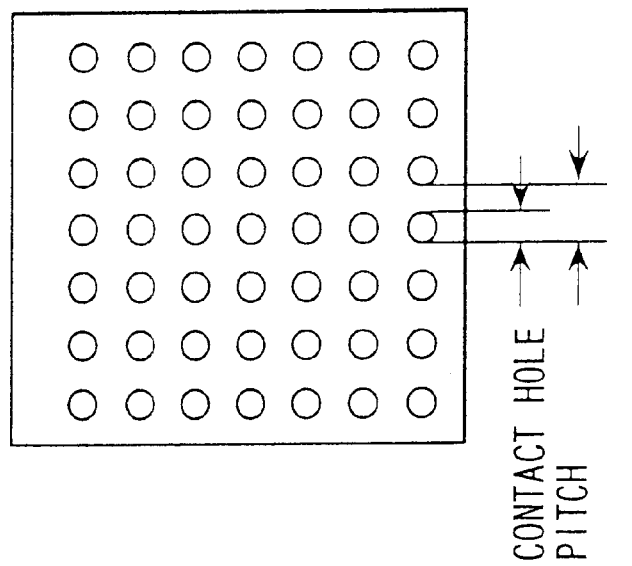
FIGS. 2(a), 2(b) and 2(c) are diagrams showing examples of patterns used obtaining correction data according to the present invention.
Figure 2B:
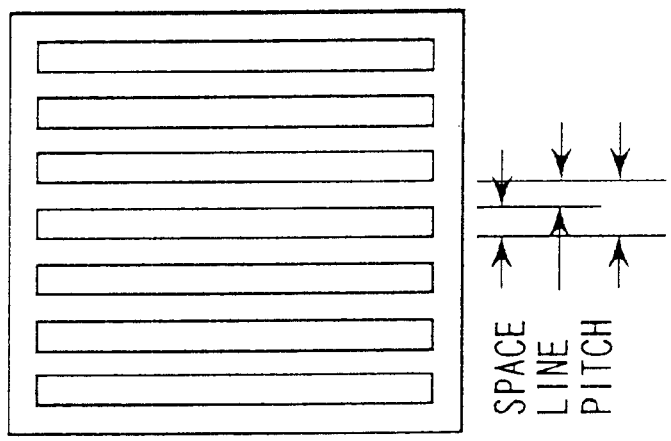
Figure 2A:
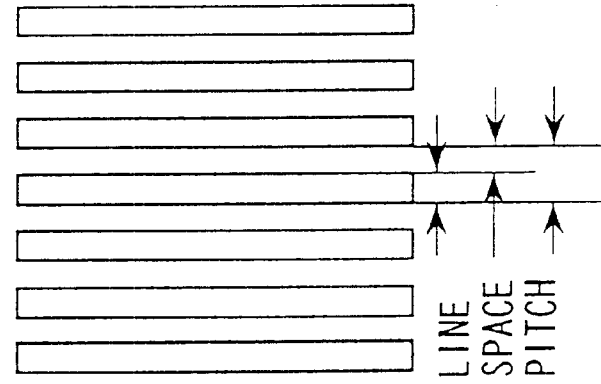

FIG. 2(a) through 2(c) show examples of patterns used for obtaining correction data. The patterns used for obtaining correction data are test patterns which are formed on a free region within a chip or on a border portion (scribe) between chips. As these test patterns, such as a line and space patterns as illustrated in FIG. 2(a), a space and line pattern as illustrated in FIG. 2(b) or a contact hole pattern as illustrated in FIG. 2(c) can be used.

After moving to the pattern used for obtaining correction data, the length of the pattern is measured to obtain length measurement data (S 104). Subsequently, a comparison between the length measurement data and a design value (true value) is performed (S 105). At this instance, since the line width and the space width in a pattern formed by exposing light can vary due to such as proximity effect and light interference, therefore, it is preferable to use a measured data of pitch length.

However, if there are no such problems the measured data of the line width and the space width can be used. As a result of the comparison between the length measurement data and the design value (true value), if no size error is recognized, a magnification correction coefficient obtained during length measurement of a standard wafer is used (S 106), and all of the length measurement points are measured therewith (S 107).

When as a result of comparison between the length measurement data and the design value (true value) a size error is caused, a magnification correction coefficient which removes the size error component is calculated (S 108). For example, it is assumed that when the magnification Mag of the SEM is 100,000 times, a scanning width (or field of view) EI of electron beams is 1,500 nm, and further, it is assumed that when pitch width of 400 nm is measured with a standard wafer, the output value is 402 nm, the error component of 2 nm has to be eliminated. In this instance, a correction is performed by varying EI × magnification correction coefficient, and normally since the magnification coefficient Mag(a)=1, in that EI×1.0, the magnification correction coefficient in this instance is assumed as Mag(a)= 0.995. Under this condition if the same result can not be obtained when another wafer pattern is measured, another magnification correction coefficient is again calculated from a correction pattern. The magnification correction coefficient Mag(a) is calculated by dividing the design value (true value) by the length measurement value. For example, when a value calculated from a correction pattern on a wafer having a SiN film is 410 nm and the design data (true value) is 400 nm, the magnification correction coefficient Mag(a) is determined as 0.9756.

When the length measurement is performed thereafter while using the magnification correction coefficient Mag(a) (=0.9756), a true value can be obtained. Accordingly, at first the first length measurement point is measured (S 109) and a true length measurement value is calculated by multiplying the length measurement value by the determined magnification correction coefficient (S 110). Subsequently, other length measurement points are measured, and true length measurement values are likely calculated based on the previously obtained magnification correction coefficient (S 111). When the length measurement for all of the length measurement points is completed, the wafer is unloaded (S 112) and the process ends.

Figure 3:
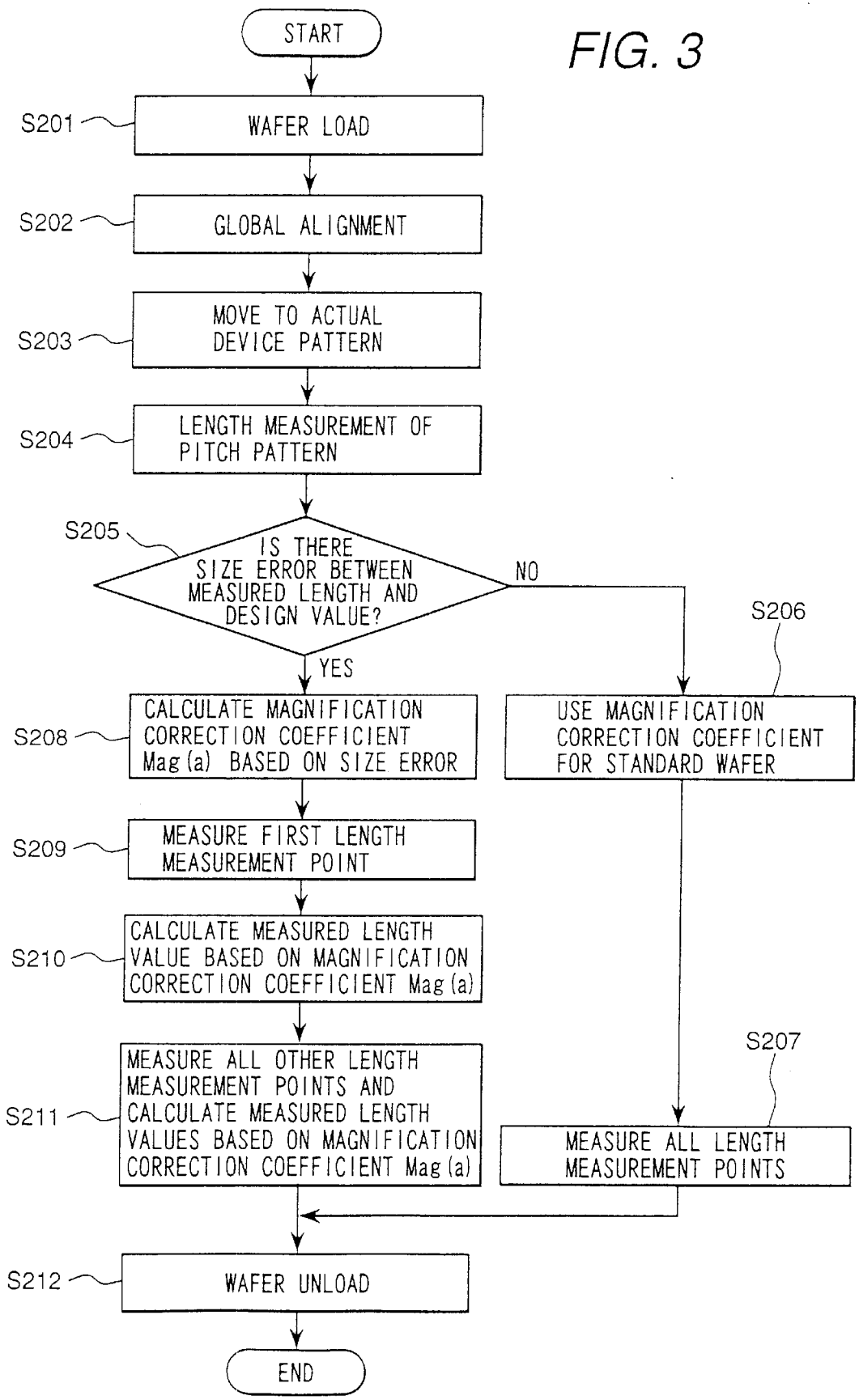
FIG. 3 is a flow chart for explaining another embodiment of length measurement method with a length measurement SEM according to the present invention.

FIG. 3 is a flow chart for explaining another embodiment of length measurement method with a length measurement SEM according to the present invention. Herein, without using a particular pattern used for obtaining correction data but by using a pattern formed in an actual device (chip) and of which size is already known, the magnification correction coefficient is calculated. Accordingly, in the present embodiment, it is unnecessary to form in advance a test pattern such as on a scribe and a free region on a chip.

Figure 4:
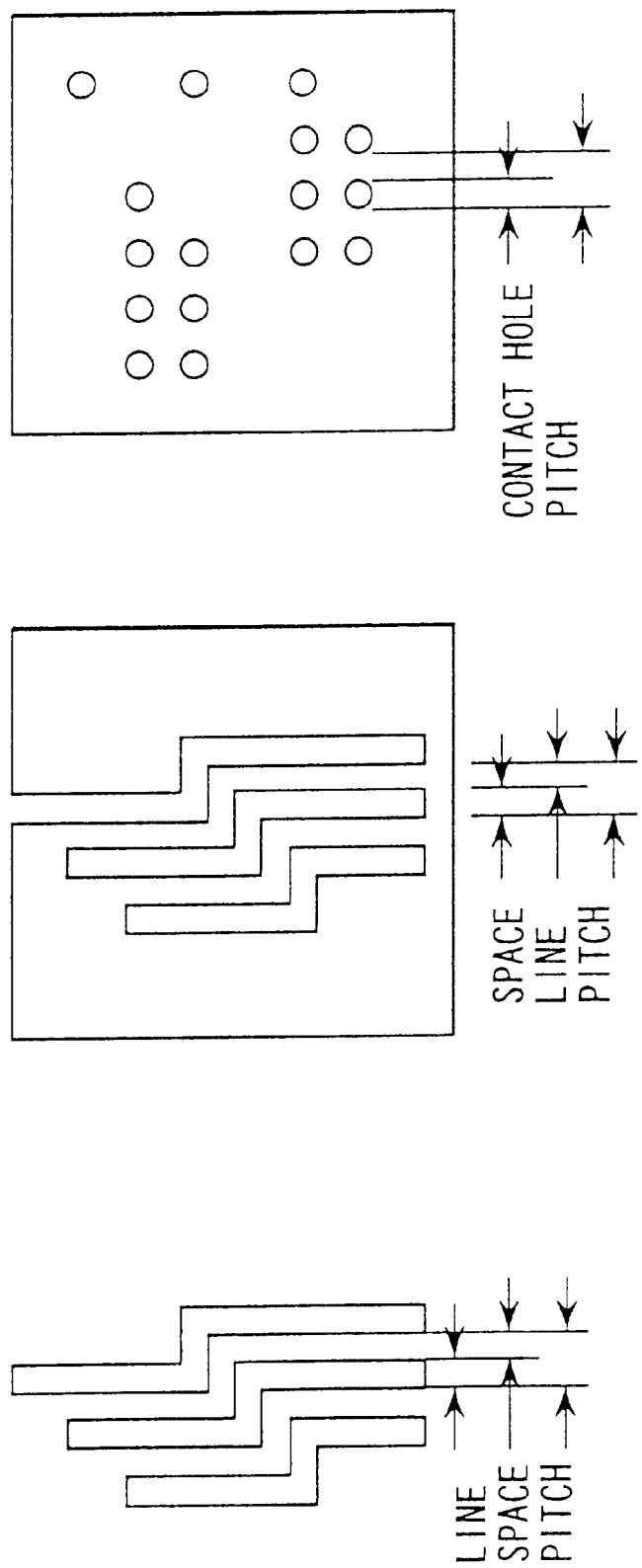
FIGS. 4(a), 4(b) and 4(c) are diagrams showing examples of patterns which are formed within an actual device and are used for calibrating length measurement value with a length measurement SEM according to the present invention.

At first, a wafer to be subjected to length measurement with a length measurement SEM is placed in a chamber (S 201) and a global alignment thereof is performed (S 202). Thereafter, prior to the length measurement of a first length measurement point, a measurement process is moved to a position such as an already known line and space pattern and contact hole pattern which are formed in an actual device (S 203) and the pitch pattern length is measured (S 204). FIGS. 4(a) through 4(c) are diagrams showing examples of patterns which are formed in an actual device and can be used for calibrating the length measurement value with the length measurement SEM. These patterns include such as a line and space pattern as illustrated in FIG. 4(a), a space and line pattern as illustrated in FIG. 4(b) and a contact hole pattern as illustrated in FIG. 4(c). Subsequently, a comparison between the length measurement data obtained during pitch pattern length measurement and a design value (true value) is performed (S 205). At this instance, since the line width and the space width in a pattern formed by exposing light can vary due to such as proximity effect and light interference, therefore, it is preferable to use measured data of pitch length.

However, if there are no such problems the measured data of the line width and the space width can be used. As a result of the comparison between the length measurement data and the design value (true value), if no size error is recognized, a magnification correction coefficient obtained during length measurement of a standard wafer is used (S 206), and all of the length measurement points are measured therewith (S 207).

When as a result of comparison between the length measurement data and the design value (true value) a size error is caused, a magnification correction coefficient which removes the size error component is calculated (S 208). The magnification correction coefficient Mag(a) is calculated by dividing the design value (true value) by the length measurement value.

When the length measurement at each measurement point is thereafter performed while using the magnification correction coefficient Mag(a) thus calculated, a true value can be obtained. Accordingly, at first the first length measurement point is measured (S 209) and a true length measurement value is calculated by multiplying the length measurement value by the determined magnification correction coefficient (S 210). Subsequently, other length measurement points are measured, and true length measurement values are likely calculated based on the previously obtained magnification correction coefficient (S 211). When the length measurement for all of the length measurement points is completed, the wafer is unloaded (S 212) and the process ends.

Figure 5:
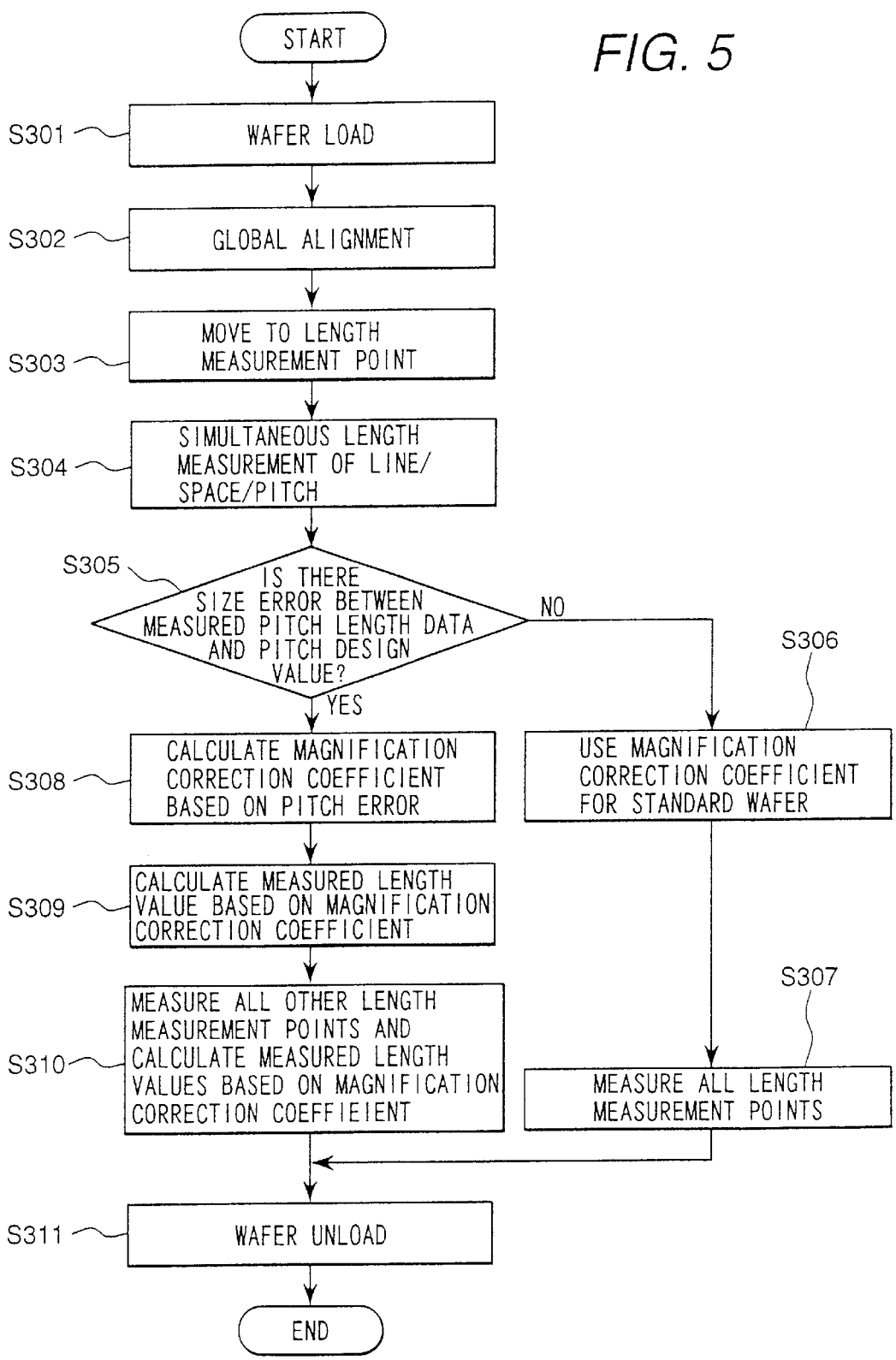
FIG. 5 is a flow chart for explaining still another embodiment of length measurement method with a length measurement SEM according to the present invention.

FIG. 5 is a flow chart for explaining still another embodiment of a length measurement method with a length measurement SEM according to the present invention. Herein, the line width, the space width and the pitch at the first length measurement point are collectively measured, and by making use pitch length measurement data among these measurement data a magnification correction coefficient mag(a) for calibrating measured length size is calculated. Therefore, in this embodiment, it is unnecessary to form in advance a test pattern such as at a scribe and a free region on a chip. However, in this instance, a pitch pattern is necessary, therefore, if the pattern at the first length measurement point is a sole pattern or a pattern with no periodicity, the measurement data can not be utilized. Accordingly, it is necessary to select a length measurement point having a periodic pattern as the first length measurement point.

At first, a wafer to be subjected to length measurement with a length measurement SEM is placed in a chamber (S 301) and a global alignment thereof is performed (S 302). Thereafter, the measurement process moves to a pattern of the actual device at the first length measurement point (S 303), and the line width, the space width and the pitch are collectively measured (S 304). Subsequently, a comparison between the pitch length measurement data and a pitch design value (true value) is performed (S 305). At this instance, since the line width and the space width in a pattern formed by exposing light can vary due to such as proximity effect and light interference, therefore, it is preferable to use measured data of pitch length.

However, if there are no such problems, the measured data of the line width and the space width can be used. As a result of the comparison between the length measurement data and the design value (true value), if no size error is recognized, a magnification correction coefficient obtained during length measurement of a standard wafer is used (S 306), and all of the length measurement points are measured therewith (S 307).

When as a result of comparison between the pitch length measurement data and the pitch design value (true value) a pitch size error is caused, a magnification correction coefficient which removes the pitch size error component is calculated (S 308). The calculated value is fed back to the length measurement values of the line width and the space width at the first length measurement point. Namely, by multiplying the length measurement values of the line width and the space width at the first length measurement point by the magnification correction coefficient Mag(a), true values thereof are obtained (S 309). Subsequently, other length measurement points are measured, and true length measurement values are likely calculated based on the previously obtained magnification correction coefficient (S 311).

When the length measurement for all of the length measurement points is completed, the wafer is unloaded (S 312) and the process ends.

Figure 6:
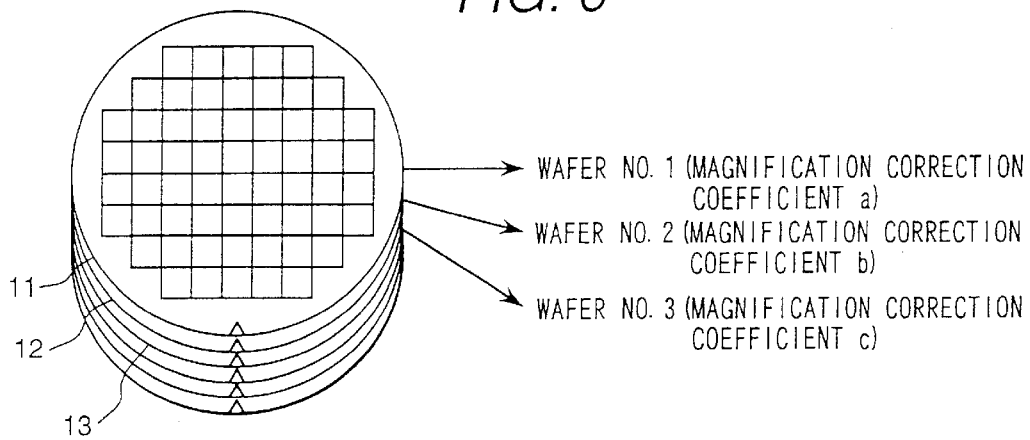
FIG. 6 is a schematic diagram for explaining a method of calculating a magnification correction coefficient for every wafer in a lot according to the present invention.

When performing a length measurement with an SEM according to the present invention, a magnification correction coefficient can be calculated for every wafer in a lot as schematically illustrated in FIG. 6. For example, when it is assumed that a magnification correction coefficient with regard to a wafer 11 determined according to the method of FIG. 1, FIG. 3 or FIG. 5 is a, a magnification correction coefficient with regard to a wafer 12 determined according to the method of FIG. 1, FIG. 3 or FIG. 5 is b, and a magnification correction coefficient with regard to a wafer 13 determined according to the method of FIG. 1, FIG. 3 or FIG. 5 is c, a true size with regard to the wafer 11 can be determined by multiplying the length measurement value with the length measurement SEM by the magnification correction coefficient a, a true size with regard to the wafer 12 can be determined by multiplying the length measurement value with the length measurement SEM by the magnification correction coefficient b, and a true size with regard to the wafer 13 can be determined by multiplying the length measurement value with the length measurement SEM by the magnification correction coefficient c.

In the embodiments according to the present invention as has been explained hitherto, since the degree of charges and influences by bias voltages vary depending on difference such as in insulation films and experienced processes for every process, the magnification correction coefficient is determined for every specimen (respective process wafers or a wafer single body) and a true value is obtained by correcting the length measurement value.

Figure 7:
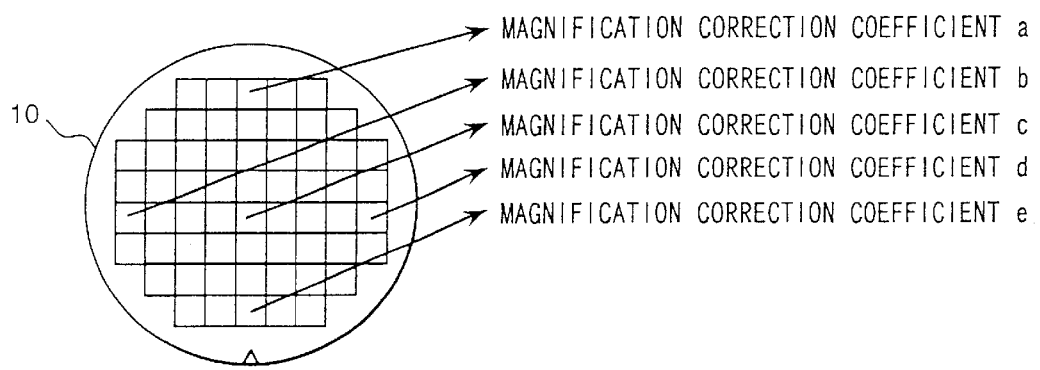
FIG. 7 is a schematic diagram for explaining a method of calculating a magnification correction coefficient for every chip in a wafer according to the present invention.

However, even in a single wafer, it can happen that an application condition of bias voltage varies between at a wafer center portion and at a wafer peripheral portion. For this reason, a magnification correction coefficient can be obtained for every chip of respective specimens, and for the length measurement for a same chip the same magnification correction coefficient can be used to obtain a true value for the length measured value. Namely, instead of using a single magnification correction coefficient for one piece of wafer, respective magnification correction coefficients a through e are calculated for respective chips within a single wafer 10 as schematically illustrated in FIG. 7, thereby, by multiplying respective length measurement values with the length measurement SEM for the respective chips by the corresponding magnification correction coefficients a through e, true size values can be obtained.

Figure 8:
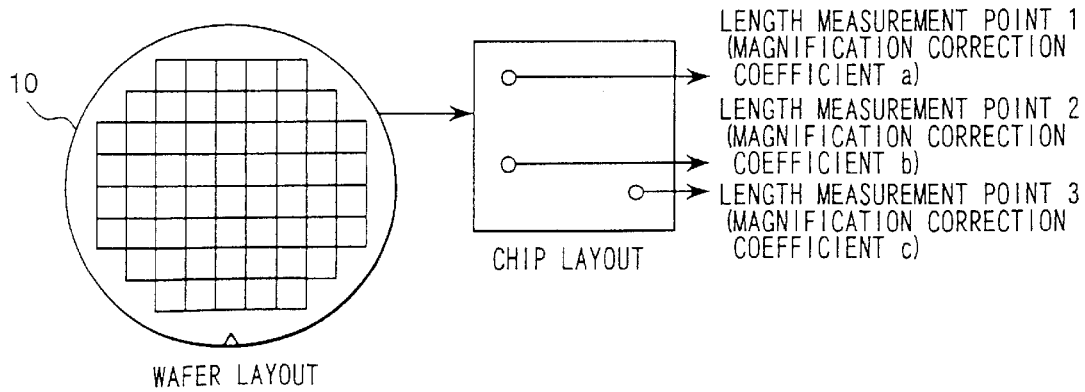
FIG. 8 is a schematic diagram for explaining a method of calculating a magnification correction coefficient for every length measurement point according to the present invention.

Further, even with the length measurement in a same chip, degree of charge varies depending on irradiation region of incident beams and the under layer construction such as film type, film thickness and the combination thereof, therefore, by obtaining a magnification correction coefficient for every measurement point of respective chips in respective specimens, a true value for each of the length measurement value can be obtained. Namely, as illustrated schematically in FIG. 8, a magnification correction coefficient for every length measurement point of respective chips in respective wafers is calculated and by making use of the calculated magnification correction coefficient a true size thereof can be determined.

Methods as has been explained hitherto are ones in which a true size is determined by multiplying a length measurement value measured by a length measurement SEM by a magnification correction coefficient. Contrary thereto, methods which will be explained hereinbelow with reference to FIG. 9 through FIG. 14 are ones in which an incident voltage of electron beams onto a specimen is controlled so that a landing voltage thereof assumes a design value. With these methods, the length measurement value measured with a length measurement SEM itself represents a true size as it is without necessitating correction by making use of a magnification correction coefficient.

Figure 9:
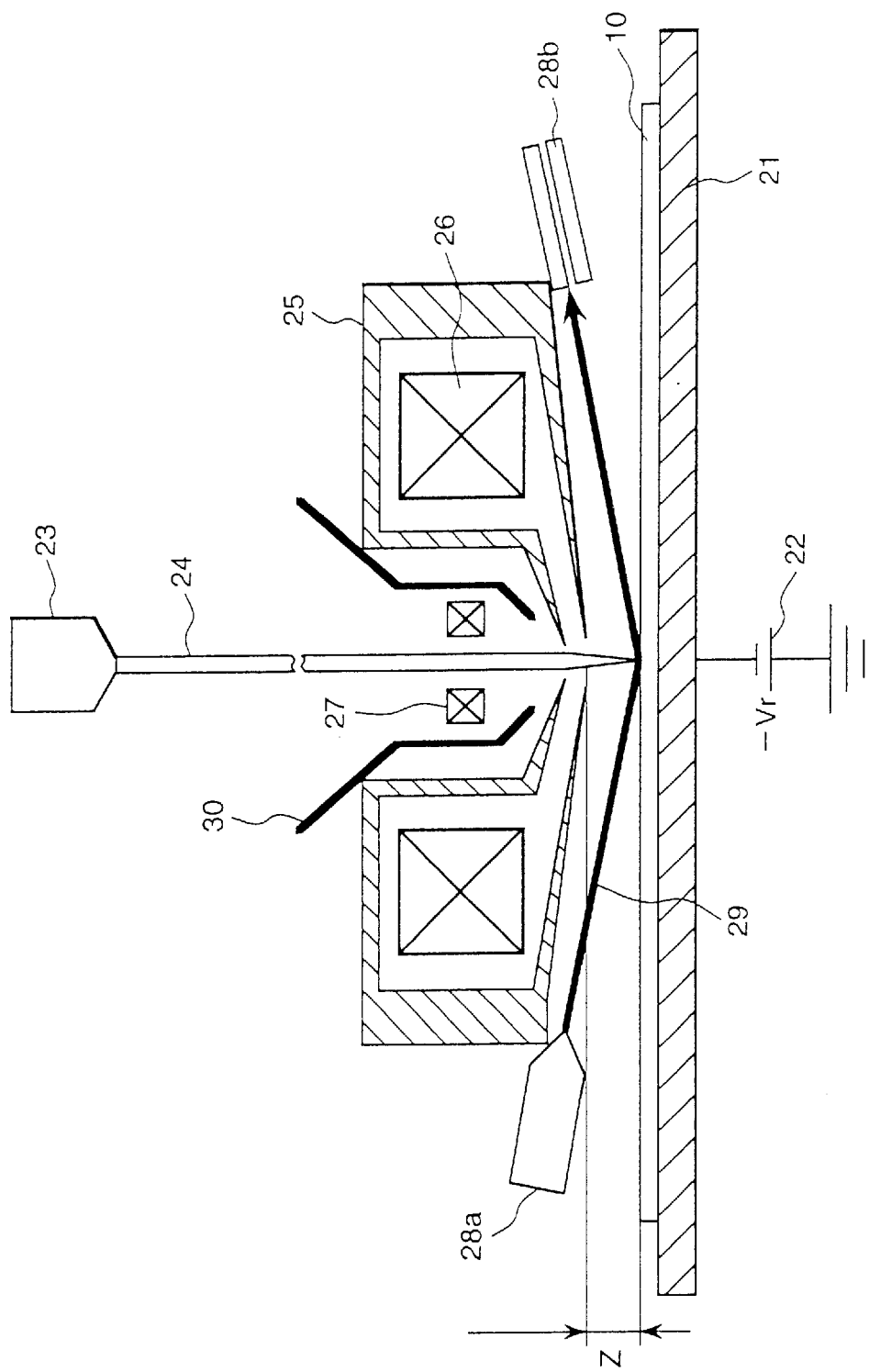
FIG. 9 is a schematic diagram around an objective lens in a length measurement SEM device which employs the retarding method.

At first, an embodiment in which no Z axis drive system for a wafer stage 21 is provided will be explained with reference to FIG. 9 and FIG. 10. FIG. 9 is a schematic diagram around an objective lens in a length measurement SEM device which employs the retarding method. A wafer 10 held on the wafer stage 21 is applied of a retarding voltage −Vr from a power source 22. Incident electron beams 24 accelerated by an electron gun 23 with an acceleration voltage V0 are converged onto the wafer 10 by an objective lens 25 excited by an excitation coil 26. The incident electron beams 24 are caused to scan over the wafer 10 by a deflection coil 27 and secondary electrons emitted from the wafer 10 are detected by a secondary electron detector (not shown). An extracting electrode 30 is one which is designed to extract upward the secondary electrons emitted from the wafer 10. Distance Z from the objective lens 25 to the surface of the wafer 10 is detected by a Z sensor provided with a light source 28a and a photo detector 28b. The Z sensor 28a and 28b makes incidence of light beams 29 from the light source 28a onto the surface of the wafer 10 in an inclined manner and detects at the photo detector 28b the incidence position of the light beams 29 reflected by the wafer 10, thereby, an error $\Delta Z$ between the distance provided as a focusing distance of the objective lens 25 and the distance from the objective lens 25 to the surface of the wafer 10 can be detected.

Figure 10:
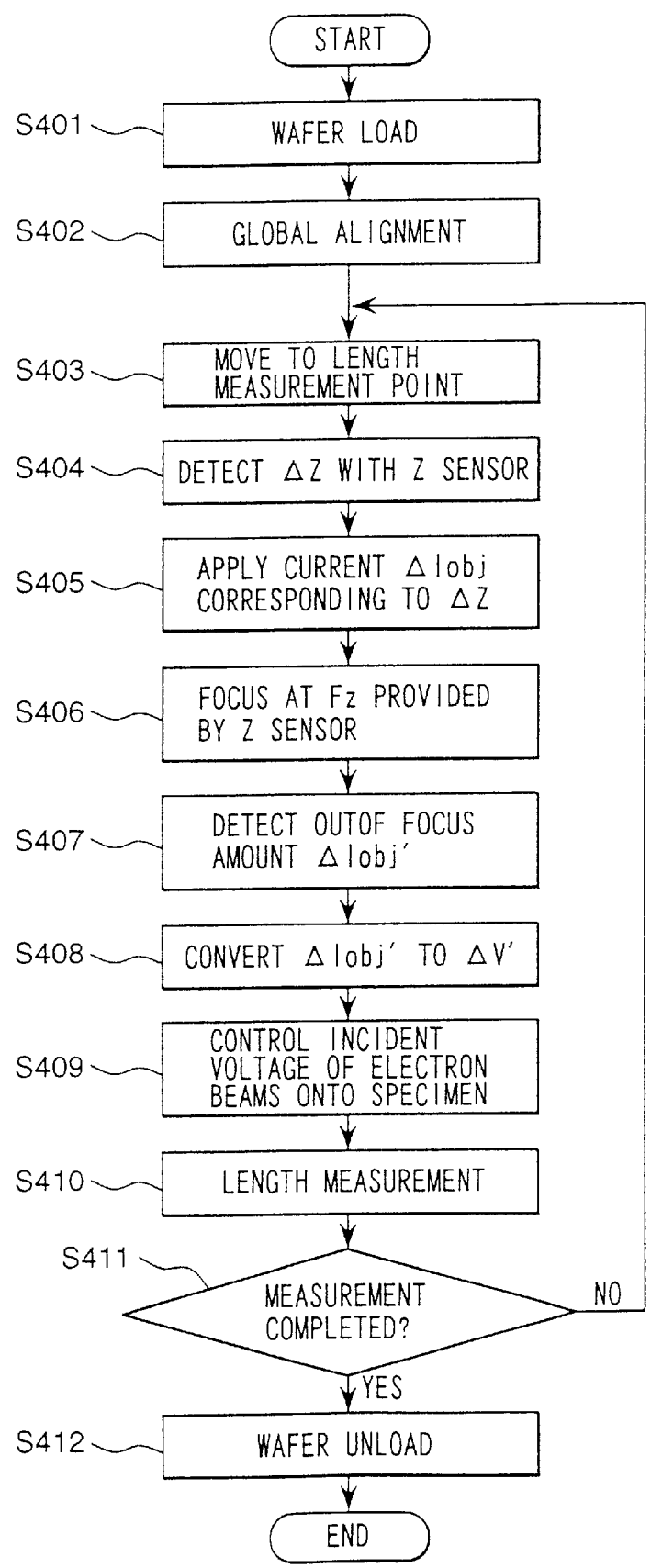
FIG. 10 is a flow chart showing an embodiment of a method according to the present invention which controls an incidence voltage of electron beams onto a specimen so that a landing voltage assumes a design value.

In the present method, as illustrated in the flow chart in FIG. 10, at first the wafer 10 is loaded on the wafer stage 21 (S 401), and a global alignment thereof is performed (S 402), thereafter, the stage 21 is moved to a first length measurement point (S 403). FIG. 11(a) shows a positional relationship at this moment between the focusing distance of the objective lens 25 and the wafer 10. The focusing distance of the objective lens 25 is set at an initial value of the device and the focus thereof is not placed on the surface of the wafer 10. Subsequently, with the Z sensor 28a and 28b an outof focus $\Delta Z$ is detected (S 404), and a correction current $\Delta Iobj$ for objective lens excitation current corresponding to $\Delta Z$ is provided to the excitation coil 26 (S 405). Thus, the focus distance of the objective lens 25 is set at a focus point $F_z$ provided by the Z sensor 28a and 28b as illustrated in FIG. 11(b) (S 406).

However, it is an ideal case that the focus of the incident beams 24 meets on the surface of the wafer 10 through an application of the correction current $\Delta Iobj$ to the excitation coil 26 as illustrated in FIG. 11(b), and practically because of charges on the surface of the wafer 10 or a setting error of the retarding voltage applied on the wafer 10 an outof focus $\Delta Z$ ' is caused as illustrated in FIG. 11(c). Subsequently, current value $\Delta Iobj'$ for the excitation coil 26 is varied while observing the secondary electron detection signal of the length measurement SEM and a best focus point Fb is determined which compensates the outof focus $\Delta Z'$ caused by fulfillment failure with the Z sensor. Thus a current value $\Delta Iobj'$ for the excitation coil 26 corresponding to the outof focus amount $\Delta Z'$ is determined (S 407). Thereafter, the current value $\Delta Iobj'$ for compensating $\Delta Z'$ component is converted into an acceleration voltage $\Delta V'$ (S 408), and then the incidence voltage of the electron beams onto the specimen is controlled (S 409). When controlling the incidence voltage, it is enough if the landing voltage is kept constant, therefore, $\Delta V'$ can be controlled either at the side of the incidence voltage (electron gun), at the side of bias voltage (retarding voltage) 22 or the combination thereof.

Thus, while keeping the landing voltage at the set value, the length measurement is performed (S 410). In this instance, as the excitation current for the objective lens 25 one set in correspondence with the detection value by the Z sensor at the step 405 is used, however, by making use of an image signal the focusing can be adjusted again. After the length measurement, it is judged whether all of the measurements are completed by the length measurement of the concerned length measurement points (S 411), and if completed the wafer 10 is unloaded (S 412) and the measurement process ends. Further, if length measurement points to be measured still remain, the stage moves to the subsequent length measurement point (S 403), and the like processes are repeated until all of the length measurement for the length measurement points is completed.

With the above method, pitches in the patterns as shown in Table 1 are measurement, in that in a Si pattern formed on a Si wafer, a pattern on B-PSG film having film thickness 400 nm, a pattern on $SiO_2$ film having film thickness 10 nm, a pattern on $SiO_2$ film having film thickness 100 nm, a pattern on SiN film, a pattern on HTO×SiN film (35 nm) and a pattern on SiON film having film thickness 25 nm formed on a Si wafer and a pattern on actual devices A and B.

Design values of length measured pitch are 350 nm, 400 nm, 500 nm, 600 nm, 700 nm and 800 nm. The measurement results are shown in Table 2. The unit of all numeral values in the Table is nm.

TABLE 2

| | Pitch design value (nm) | | | | | |
|---|---|---|---|---|---|---|
| | 350.00 | 400.00 | 500.00 | 600.00 | 700.00 | 800.00 |
| Si Pattern | 350.32 | 400.18 | 500.01 | 600.20 | 700.52 | 800.86 |
| B-PSG (400 nm) | 349.80 | 400.12 | 499.90 | 600.00 | 700.06 | 799.80 |
| SiO$_2$ (10 nm) | 350.10 | 400.14 | 500.12 | 600.00 | 700.06 | 799.89 |
| SiO$_2$ (100 nm) | 350.04 | 399.92 | 499.90 | 600.00 | 699.75 | 800.12 |
| SiN (10 nm) | 350.20 | 399.94 | 499.85 | 600.00 | 700.19 | 799.86 |
| HTO + SiN (35 nm) | 349.90 | 399.64 | 500.25 | 600.00 | 700.15 | 799.95 |
| SiON (25 nm) | 349.86 | 399.72 | 500.19 | 600.00 | 699.81 | 799.91 |
| Device A | 349.90 | 400.16 | 499.86 | 600.00 | 700.06 | 799.89 |
| Device B | 350.07 | 400.22 | 499.87 | 600.00 | 699.81 | 800.20 |

Figure 17:
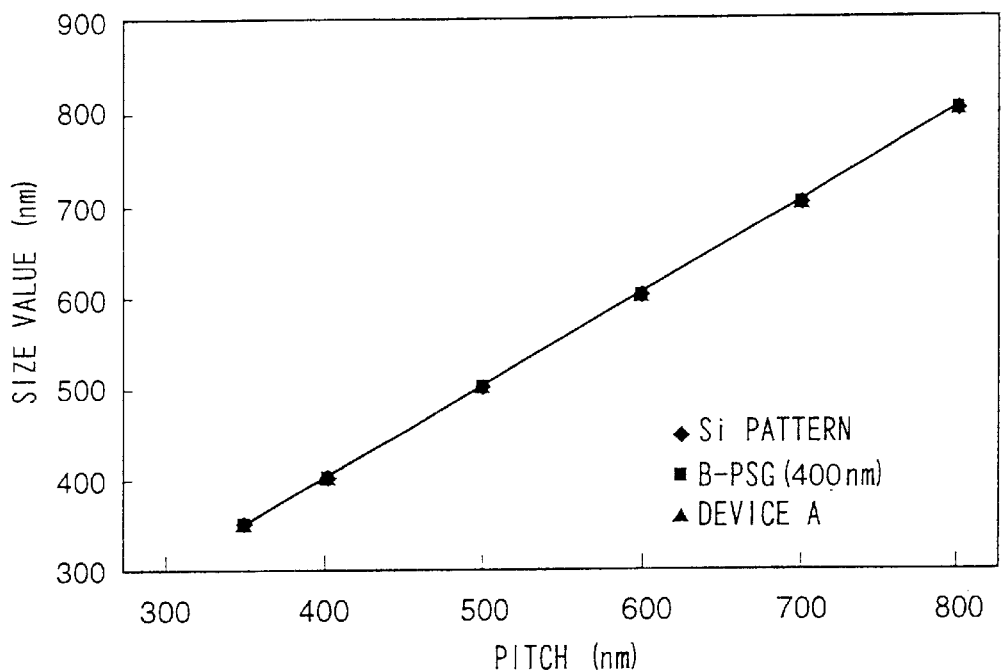
FIG. 17 is a diagram showing a relationship between SEM length measurement value (in ordinate) and designed pitch value (in abscissa) according to the methods of the present invention.

FIG. 17 illustrates a relationship between pitch design values (in abscissa) and SEM length measurement values (in ordinate) obtained from data in connection with Si pattern, pattern on B-PSG film and pattern of actual device A among the length measurement data as shown in Table 2. It is observed that the three length measurement values substantially overlap each other, in that not only the pitch length measurement value of the Si pattern but also these of the B-PSG film and the actual device A correctly coincide with their design values. This is because the influence of the charge-up of the specimen surface due to electron beam irradiation is taken into account for the pattern length measurement on the B-PSG insulation film and the actual device A.

Figure 18:
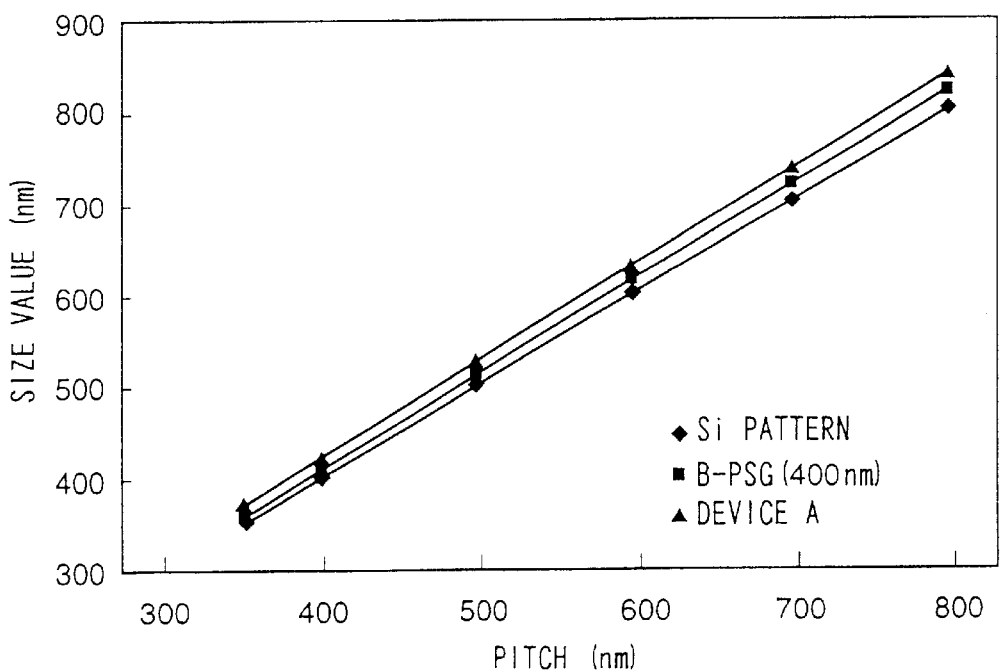
FIG. 18 is a diagram showing a relationship between SEM length measurement value (in ordinate) and designed pitch value (in abscissa) according to a conventional method.

In the conventional art, if conditions such as the material of a specimen, film thickness thereof, type thereof and combination thereof differ with regard to patterns used for pitch calibration and a specimen to be subjected to measurement, such as the charge-up due the incident electrons and the insulation resistance of the specimen itself vary, therefore, it was rare that the length measurement values always assume true values (absolute values) thereof as exemplified in Table 1 and FIG. 18. However, according to the present invention, even if the conditions with regard to the patterns used for pitch calibration and the specimen to be subjected to measurement differ, it is possible to obtain true values as shown in Table 2 and FIG. 17.

Now, another embodiment in which a Z axis drive system for the wafer stage is provided will be explained with reference to FIG. 9 and FIG. 12.

Figure 12:
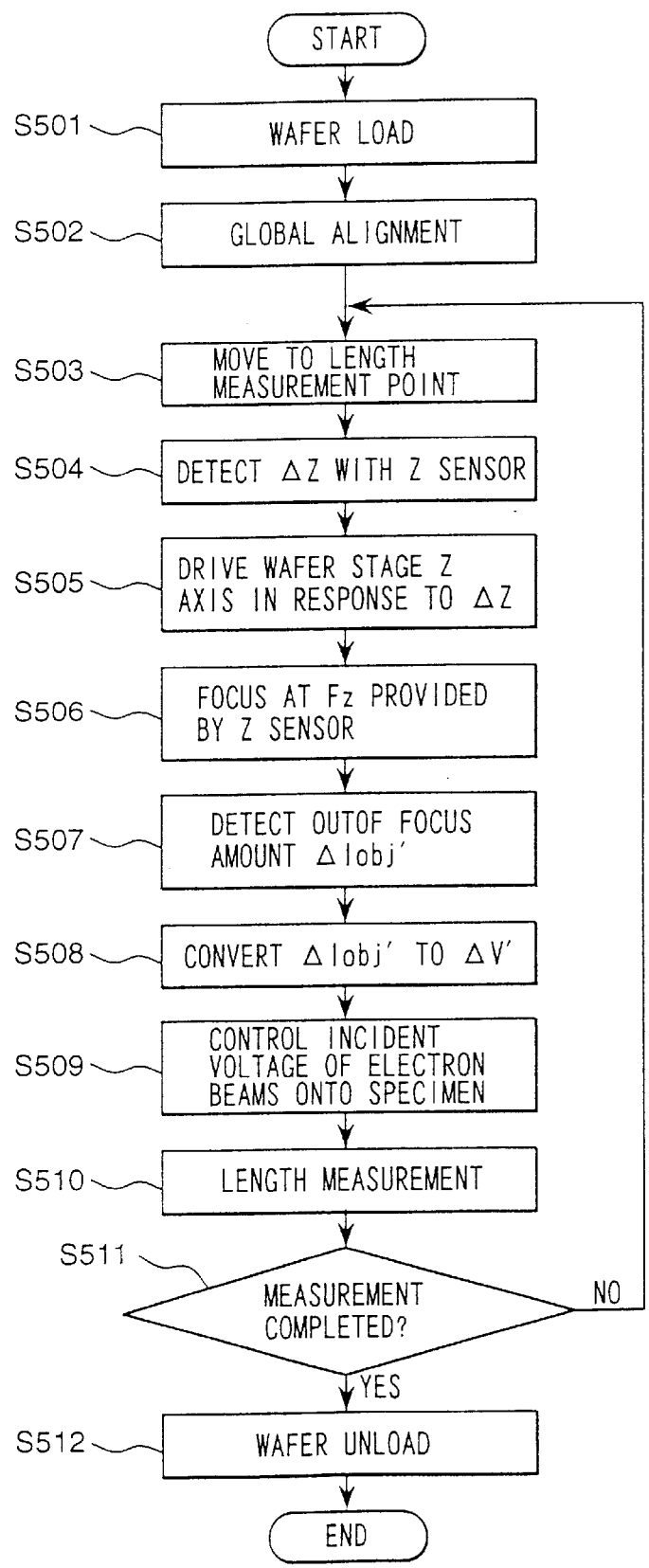
FIG. 12 is a flow chart showing another embodiment of a method according to the present invention which controls an incidence voltage of electron beams onto a specimen so that a landing voltage assumes a design value.

In the present method, as illustrated in the flow chart in FIG. 12, at first, the wafer 10 is loaded on the wafer stage 21 (S 501), and a global alignment thereof is performed (S 502), thereafter, the stage 21 is moved to a first length measurement point (S 503). Subsequently, with the Z sensor 28a and 28b an outof focus $\Delta Z$ is detected (S 504). Then, in response to the detected $\Delta Z$ the wafer stage 21 is driven in Z axis (S 505), and the focus distance of the objective lens 25 is set at a focus point $F_z$ provided by the Z sensor 28a and 28b (S 506).

However, even with the present method, it is an ideal case that the focus of the incident beams 24 meets on the surface of the wafer 10 by positioning the wafer 10 to the focus point provided by the Z sensor, and practically because of charges on the surface of the wafer 10 or a setting error of the retarding voltage applied on the wafer 10, an outof focus ΔZ' is caused. Therefore, current value ΔIobj' for the excitation coil 26 is varied while observing the secondary electron detection signal of the length measurement SEM and a best focus point Fb is determined which compensates the outof focus ΔZ' caused by fulfillment failure with the Z sensor. Thus a current value ΔIobj' for the excitation coil 26 corresponding to the outof focus amount ΔZ' is determined (S 507). Thereafter, the current value ΔIobj' for compensating ΔZ' component is converted into an acceleration voltage ΔV' (S 508) and then the incidence voltage of the electron beams onto the specimen is controlled (S 509). When controlling the incidence voltage, it is enough if the landing voltage is kept constant, therefore, ΔV' can be controlled either at the side of the incidence voltage (electron gun), at the side of bias voltage (retarding voltage) 22 or the combination thereof.

Thus, while keeping the landing voltage at the set value, the length measurement is performed (S 510 ). In this instance, the excitation current for the objective lens 25 is one which permits focusing at the distance provided by the Z sensor, however, by making use of an image signal the focusing can be adjusted again. After the length measurement, it is judged whether all of the measurements are completed by the length measurement of the concerned length measurement points (S 511), and if completed the wafer 10 is unloaded (S 512) and the measurement process ends. Further, if length measurement points to be measured still remain, the stage moves to the subsequent length measuring point (S 503), and the like processes are repeated until all of the length measurement for the length measurement points is completed.

Now, still another embodiment of the present invention will be explained with reference to FIG. 9 and FIG. 13. The present embodiment relates to a length measurement SEM device employing the retarding method in which no Z axis drive system for a wafer stage 21 is provided.

Figure 13:
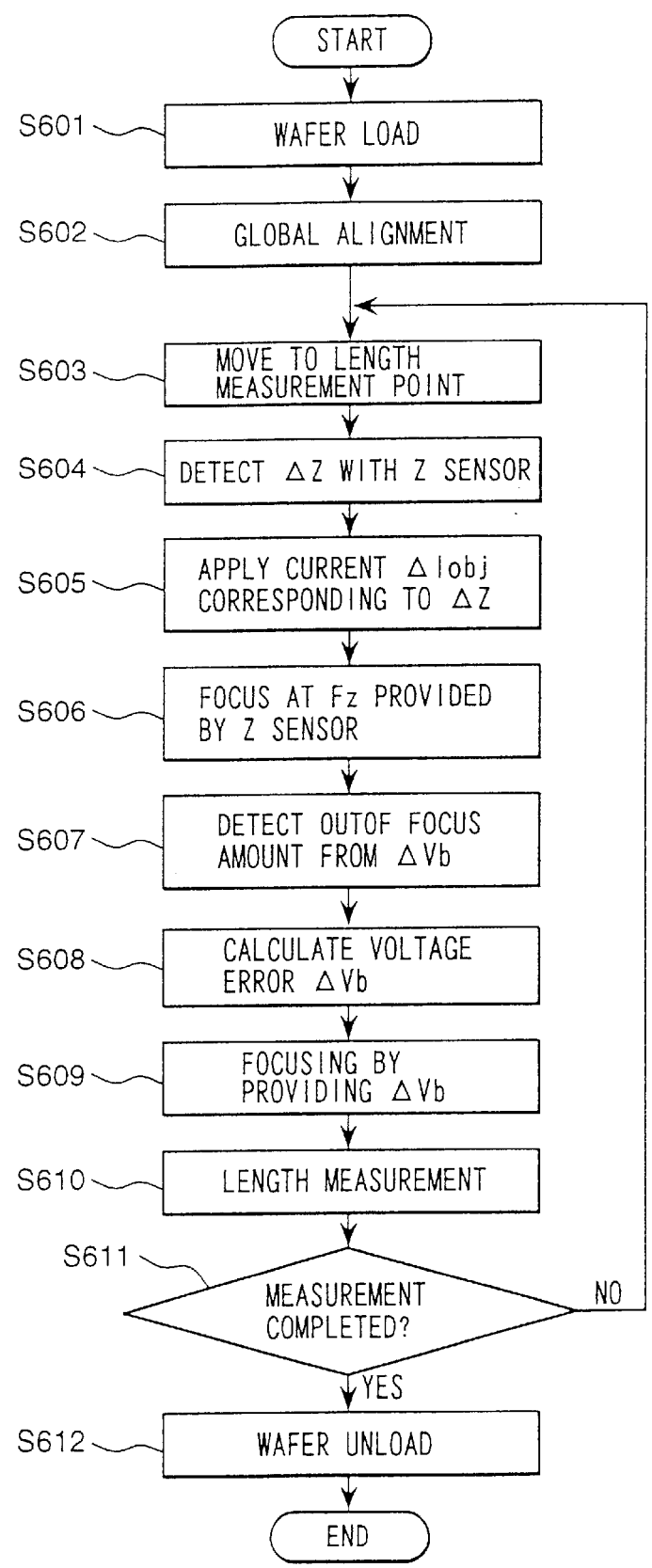
FIG. 13 is a flow chart showing still another embodiment of a method according to the present invention which controls an incidence voltage of electron beams onto a specimen so that a landing voltage assumes a design value.

As illustrated in the flow chart in FIG. 13, at first, the wafer 10 is loaded on the wafer stage 21 (S 601), and a global alignment thereof is performed (S 602), thereafter, the stage 21 is moved to a first length measurement point (S 603). With the Z sensor 28a and 28b an outof focus ΔZ is detected (S 604), and a correction current ΔIobj for objective lens excitation current corresponding to ΔZ is provided to the excitation coil 26 (S 605), thereafter, the focus distance of the objective lens 25 is set at a focus point $F_z$ provided by the Z sensor 28a and 28b (S 606).

Subsequently, a wafer bias voltage (retarding voltage) ΔVb is varied and a best focus point Fb is determined which compensates the outof focus ΔZ caused by fulfillment failure with the Z sensor (S 607). Thus, the wafer bias voltage ΔVb which provides the best focus is determined (S 608). Since the wafer bias voltage ΔVb corresponding to the outof focus component ΔZ represents the incidence voltage error, the ΔVb is applied either at the side of the incidence voltage (electron gun), at the side of the wafer bias or the combination thereof to keep the landing voltage constant (S 609).

Thus, while keeping the landing voltage at the set value, the length measurement is performed (S 610 ). In this instance, the excitation current for the objective lens 25 is one which permits focusing at the distance provided by the Z sensor at the step 605, however, by making use of an image signal the focusing can be adjusted again. After the length measurement, it is judged whether all of the measurements are completed by the length measurement of the concerned length measurement points (S 611), and if completed the wafer 10 is unloaded (S 612) and the measurement process ends. Further, if length measurement points to be measured still remain, the stage 21 moves to the subsequent length measuring point (S 603), and the like processes are repeated until all of the length measurement for the length measurement points is completed.

Figure 14:
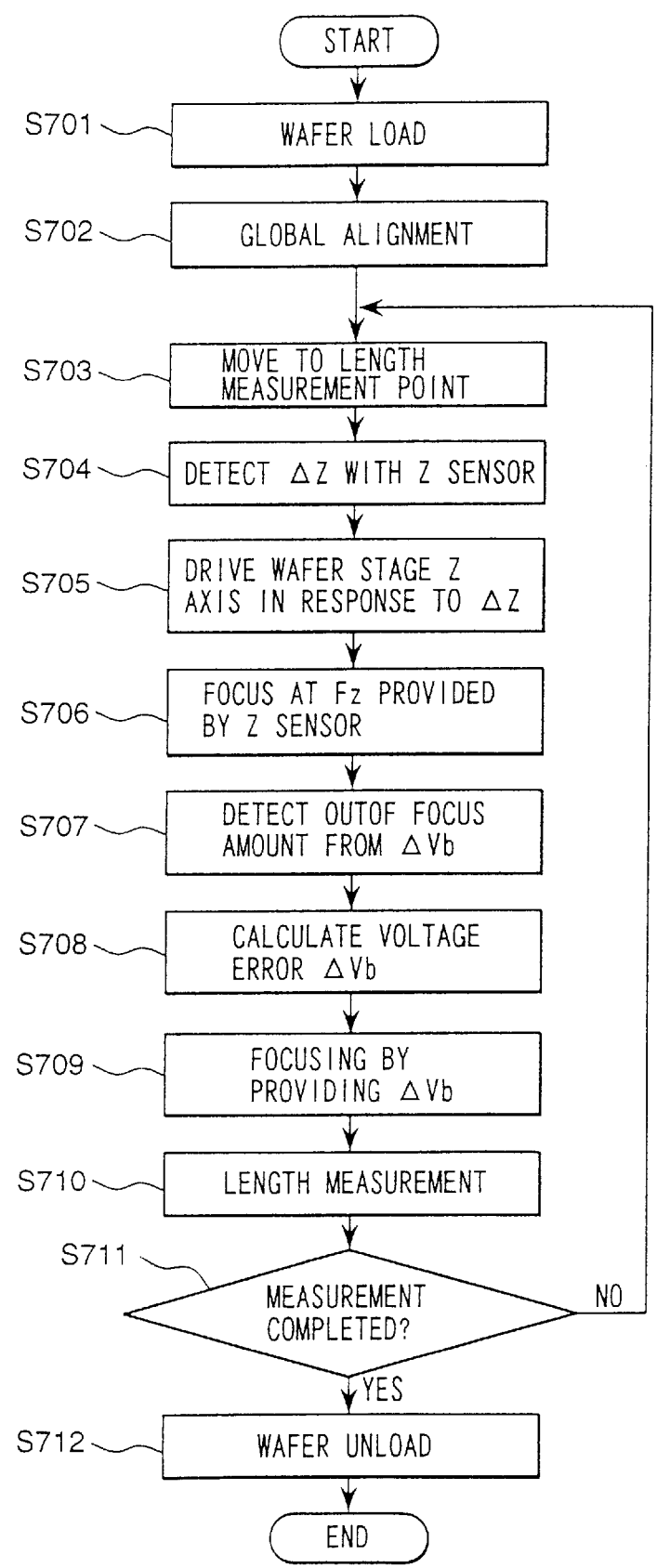
FIG. 14 is a flow chart showing a further embodiment of a method according to the present invention which controls an incidence voltage of electron beams onto a specimen so that a landing voltage assumes a design value.

Now, a further embodiment in which a Z axis drive system for a wafer stage is provided will be explained with reference to the flow chart as shown in FIG. 14, at first, the wafer 10 is loaded on the wafer stage 21 in the length measurement SEM (S 701), and a global alignment thereof is performed (S 702), thereafter, the stage 21 is moved to a first length measurement point (S 703). Subsequently, with the Z sensor 28a and 28b an outof focus ΔZ is detected (S 704), in correspondence with ΔZ the wafer stage 21 is driven in Z axis (S 705), thereafter, the focus distance of the objective lens 25 is set at a focus point $F_z$ provided by the Z sensor 28a and 28b (S 706).

Subsequently, a wafer bias voltage (retarding voltage) ΔVb is varied and a best focus point Fb is determined which compensates the outof focus ΔZ' caused by fulfillment failure with the Z sensor (S 707). Thus, the wafer bias voltage ΔVb which provides the best focus is determined (S 708). Since the wafer bias voltage ΔVb corresponding to the outof focus component ΔZ' represents the incidence voltage error, the ΔVb is applied either at the side of the incidence voltage (electron gun), at the side of the wafer bias or the combination thereof to keep the landing voltage constant (S 709).

Thus, while keeping the landing voltage at the set value, the length measurement is performed (S 710). After the length measurement, it is judged whether all of the measurements are completed by the length measurement of the concerned length measurement points (S 711), and if completed the wafer 10 is unloaded (S 712) and the measurement process ends. Further, if length measurement points to be measured still remain, the stage 21 moves to the subsequent length measuring point (S 703), and the like processes are repeated until all of the length measurement for the length measurement points is completed.

Now, a still further embodiment of the present invention will be explained with reference to FIG. 15 in which an actual landing voltage of specimen incident electron beams affected by ΔV due to charge-up of the specimen surface (surface potential variation at the position where the incident beams are irradiated) is determined and a length measurement value by an SEM is corrected by making use of a magnification correction coefficient corresponding to the actual landing voltage.

Figure 15:
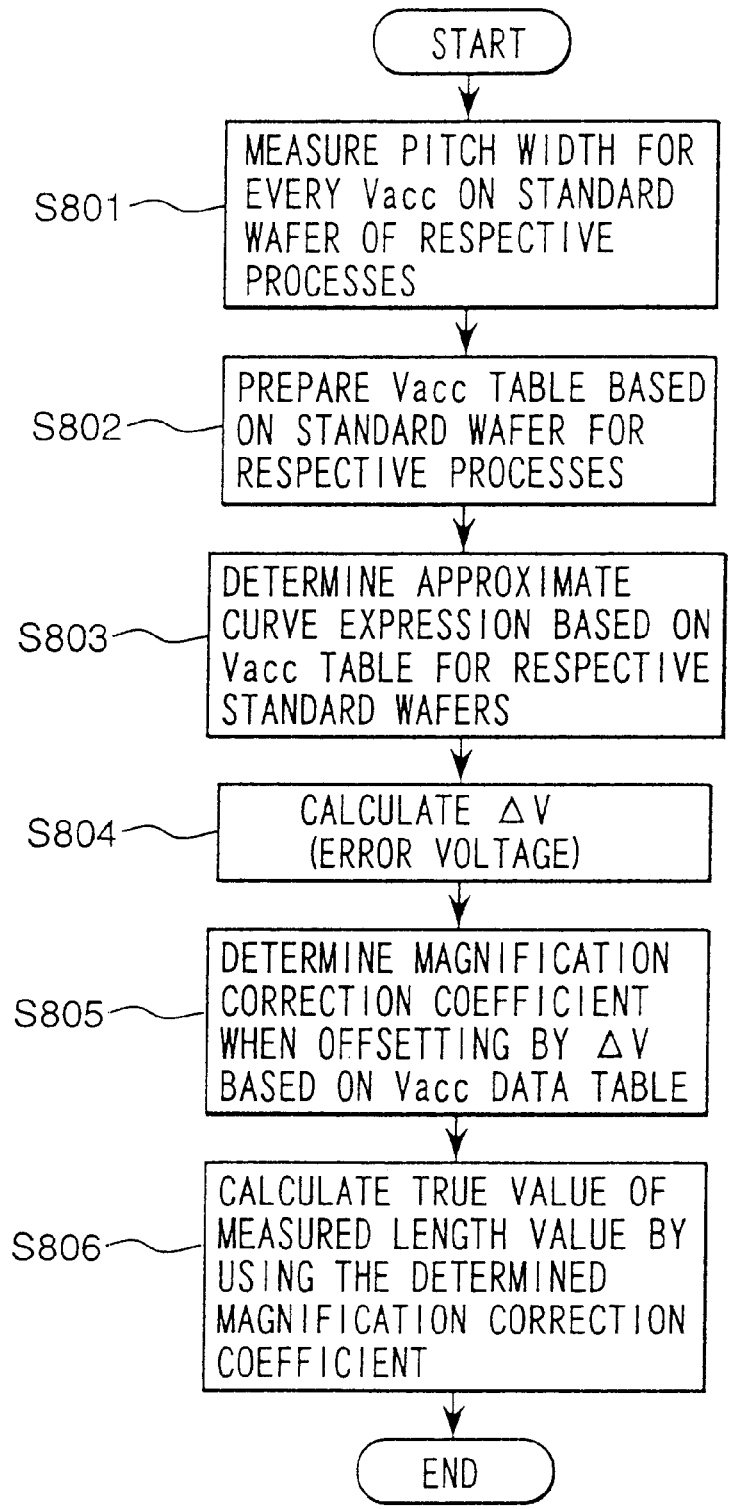
FIG. 15 is a flow chart for explaining a further embodiment of length measurement method with a length measurement SEM according to the present invention.

As shown in the flow chart in FIG. 15, at first with respect to a standard wafer in respective processes, for example, a semiconductor wafer after being subjected to a polysilicon process, a semiconductor wafer after being subjected to an $SiO_2$ process, a semiconductor wafer after being subjected to an $SiO_2$ process, a semiconductor wafer after being subjected to an SiN process, a semiconductor wafer after being subjected to a B-PSG process, a semiconductor wafer after being subjected to an Al process, a semiconductor wafer after being subjected to a W process, a semiconductor wafer after being subjected to a Cu process, a semiconductor wafer after being subjected to a plurality of the above processes and an average wafer of an actual device, a pitch is measured for every Vacc (landing voltage) (S 801). Examples of length measurement values are shown in Table 3. Table 3 shows length measurement results of a pitch having design value of 600 nm with respect to an Si wafer, actual device C and actual device D which are used as a standard wafer while varying Vacc (landing voltage) by a unit of 50V from 500V to 800V.

TABLE 3

|  | Vacc(V) | | | | | | |
| --- | --- | --- | --- | --- | --- | --- | --- |
|  | 500 | 550 | 600 | 650 | 700 | 750 | 800 |
| Design pitch value (nm) | 600 | 600 | 600 | 600 | 600 | 600 | 600 |
| Si: (nm) | 595.68 | 597.98 | 600.21 | 602.57 | 604.55 | 608.23 | 610.23 |
| Device C (nm) | 626.38 | 627.46 | 628.58 | 629.83 | 630.95 | 632.27 | 633.41 |
| Device D (nm) | 607.11 | 610.03 | 612.58 | 614.93 | 616.91 | 618.97 | 621.52 |

From the above data table, magnification correction coefficients for every Vacc are determined by dividing design values by the corresponding length measurement values with respect to a standard wafer for respective processes to prepare Vacc data table (S 802). An example of Vacc data tables is shown in Table 4.

TABLE 4

|  | Vacc(V) | | | | | | |
| --- | --- | --- | --- | --- | --- | --- | --- |
|  | 500 | 550 | 600 | 650 | 700 | 750 | 800 |
| Si | 1.0073 | 1.0034 | 0.99965 | 0.99574 | 0.99247 | 0.98647 | 0.98324 |
| Device C | 0.95789 | 0.95624 | 0.95453 | 0.95264 | 0.95095 | 0.94896 | 0.94725 |
| Device D | 0.98829 | 0.98356 | 0.97946 | 0.97572 | 0.97259 | 0.96935 | 0.96538 |

Figure 16:
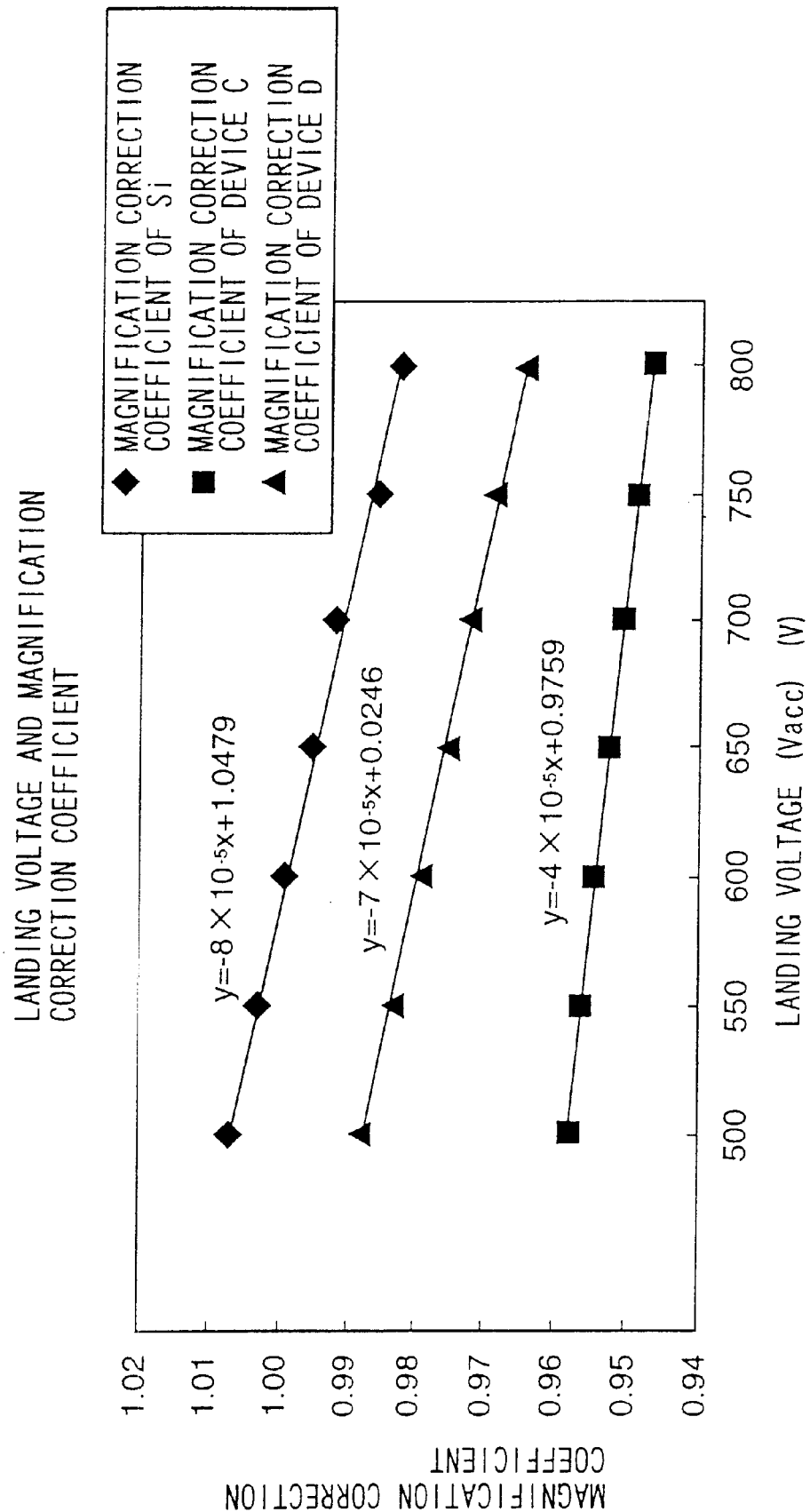
FIG. 16 is a diagram showing an example of an approximate curve expression representing a relationship between Vacc (landing voltage) and magnification correction coefficient.

Subsequently, from Vacc tables for respective standard wafers, an approximate curve expression representing a relationship between Vacc (landing voltage) and magnification correction coefficient is calculated for every standard wafer (S 803). An example of approximate curve expression obtained from Table 4 is shown in FIG. 16. Until this, the processes are preparation stages which are performed to obtain data before starting the length measurement for an actual device.

Subsequently, length measurement for an actual device is performed. Now, for example, the steps will be explained with respect to a wafer experienced of an SiON film process, at first a SiON wafer is loaded in a chamber and a global alignment therefor is performed. Since an insulation film is deposited on the SiON wafer, the landing voltage will deviate by $\Delta V$. The error voltage component $\Delta V$ is, for example, calculated according to one of the methods as has been explained in connection with FIG. 12 through FIG. 14 flow charts (S 804). When it is confirmed that the landing voltage deviates by $\Delta V$, the landing voltage actually applied on the wafer can be determined, therefore, from the approximate curve expression representing the relationship between Vacc (landing voltage) and magnification correction coefficient determined previously for the SiON standard wafer a magnification correction coefficient at a length measurement point concerned is determined (S 805).

Finally, by making use of the thus obtained magnification correction coefficient a true value is calculated from the length measurement value (S 806). For example, it is assumed that the SEM sets a landing voltage of 600V for a wafer with a SiON film, and the magnification correction coefficient for the standard wafer is 0.954 at this instance. Thereafter, when $\Delta V$ is measured, the actual landing voltage showed 550V, in such instance, instead of using the magnification correction coefficient 0.954, but by making use of the magnification correction coefficient (for example 0.956) at the time of landing voltage of 550V, in that by multiplying the length measurement value by 0.956, a true value is obtained.

According to the present invention, in the length measurement by making use of an SEM, a length measurement error due to a potential variation of the specimen surface is compensated and a true size value can be obtained. For example, with regard to a commonly used length measurement SEM which does not use the retarding method, a size measurement error due to charge-up of the specimen surface caused by incident electron irradiation is sufficiently corrected and a true value can be obtained regardless to the constitution of the specimen and the type thereof. Further, with regard to a length measurement SEM which uses the retarding method, an error between a voltage set by the SEM so as to be applied on the specimen and an actual voltage applied on the specimen is accurately corrected, thereby, the acceleration voltage applied on the specimen is always kept constant regardless to the constitution of the specimen and the type thereof.

What is claimed is:

1. A method of measuring length with a scanning electron microscope in which through scanning electron beams along a pattern on a semiconductor wafer being applied with a negative voltage, the size of the pattern is measured, comprising:

performing length measurement with the scanning electron microscope of an already known pattern provided in advance in a predetermined region on the semiconductor wafer or a chip for every semiconductor wafer including a measurement point, every chip in the semiconductor wafer on every measurement point calculating a magnification correction coefficient through comparison of the length measurement result with a designed value of the already known pattern; and determining a true size by multiplying a measured length value of a measurement point performed by the scanning type electron microscope by the obtained magnification correction coefficient.

2. A method of measuring length with a scanning electron microscope in which through scanning electron beams along a pattern on a semiconductor wafer being applied with a negative voltage, the size of the pattern is measured, comprising:

performing length measurement with the scanning electron microscope of a pattern on the semiconductor wafer or a chip for every semiconductor wafer including a measurement point, every chip in the semiconductor wafer on every measurement point calculating a magnification correction coefficient through comparison of the length measurement result with a designed value of the pattern at the measurement point; and determining a true size by multiplying a measured length value of a measurement point performed by the scanning type electron microscope by the obtained magnification correction coefficient.

3. A method of measuring length with a scanning electron microscope according to claim 2, comprising obtaining the magnification correction coefficient by making use of a pattern near a measurement point.

4. A method of measuring length with a scanning electron microscope according to claim 1, comprising obtaining the magnification correction coefficient through comparison between the length measurement value and the design value of a pitch in the pattern.

5. A method of measuring length with a scanning electron microscope according to claim 2, comprising obtaining the magnification correction coefficient through comparison between the length measurement value and the design value of a pitch in the pattern.

6. A method of measuring length with a scanning electron microscope according to claim 3, comprising obtaining the magnification correction coefficient through comparison between the length measurement value and the design value of a pitch in the pattern.

7. A method of measuring length with a scanning type electron microscope in which through scanning electron beams along a pattern on a semiconductor wafer being applied with a negative voltage, the size of the pattern is measured, comprising:

causing the scanning electron microscope to focus on a measurement point by making use of an output of a Z sensor which detects distance from an objective lens to a specimen;

determining an exciting current $\Delta Iobj$ of the objective lens which is required to eliminate an out of focus by monitoring a variation of a specimen signal being emitted from the specimen while varying the exciting current of the objective lens;

converting the exciting current $\Delta Iobj$ of the objective lens into an acceleration voltage $\Delta V$ for incident electron beams onto the specimen based on a correspondence between existing current and acceleration voltage of incident electron beams;

changing an acceleration voltage now applied for the incident electron beams onto the specimen by $\Delta V$; and, performing the length measurement of the measurement point.

8. A method of measuring length with a scanning electron microscope in which through scanning electron beams along a pattern on a semiconductor wafer being applied with a negative voltage, the size of the pattern is measured, comprising:

causing the SEM focusing on a measurement point by making use of an output of a Z sensor which detects distance from an objective lens to a specimen;

determining an applied voltage $\Delta Vb$ on the specimen which is required to eliminate, an out of focus by monitoring variation of a specimen signal being emitted from the specimen while varying the voltage applied on the specimen;

changing the acceleration voltage applied for the incident electron beams onto the specimen by $\Delta Vb$; and, performing the length measurement of the measurement point.

9. A method of measuring length with a scanning electron microscope in which through scanning electron beams along a pattern on a semiconductor wafer being applied with a negative voltage, the size of the pattern is measured, comprising:

determining in advance a correspondence between acceleration voltage of electron beams incident onto a standard specimen and magnification correction coefficient thereof;

determining an actual acceleration voltage of the electron beams incident onto a specimen at a length measurement point;

determining a magnification correction coefficient corresponding to the actual acceleration voltage of the electron beams incident onto the length measurement point with reference to the correspondence determined in advance;

performing a length measurement at the measurement point; and, determining a true size by multiplying the measured length value by the magnification correction coefficient.

10. A method of measuring length with a scanning electron microscope according to claim 9, wherein the step of determining the actual acceleration voltage of the incident electron beams at the length measurement point on the specimen includes the steps of:

determining an objective lens correction current $\Delta Iobj$ which is required to eliminate an out of focus under a condition of an objective lens excitation corresponding to acceleration voltage for electron beams set at the scanning electron microscope; and, converting the objective lens correction current $\Delta Iobj$ into an acceleration voltage $\Delta V$ for the electron beams incident onto the specimen based on a correspondence between objective lens correction current and acceleration voltage of incident electron beams.

11. A method of measuring length with a scanning electron microscope according to claim 9, wherein the step of determining the actual acceleration voltage of the incident electron beams at the length measurement point on the specimen includes the step of;

determining an application voltage $\Delta Vb$ on the specimen which is required to eliminate an out of focus under a condition of an objective lens excitation corresponding to an acceleration voltage for electron beams set at the scanning electron microscope.

* * * * *